(12) United States Patent
Pesetski et al.

(10) Patent No.: US 8,022,722 B1
(45) Date of Patent: Sep. 20, 2011

(54) QUANTUM LOGIC GATES UTILIZING RESONATOR MEDIATED COUPLING

(75) Inventors: Aaron A. Pesetski, Gambrills, MD (US); James E. Baumgardner, Odenton, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/794,439

(22) Filed: Jun. 4, 2010

(51) Int. Cl.
*H03K 19/195* (2006.01)
(52) U.S. Cl. ..................... 326/7; 326/3; 326/6
(58) Field of Classification Search .......... 326/1–7; 327/366, 367, 527, 528; 257/14
See application file for complete search history.

(56) References Cited

U.S. PATENT DOCUMENTS

| | | | |
|---|---|---|---|
| 4,117,354 A | 9/1978 | Geewala | |
| 4,916,335 A | 4/1990 | Goto et al. | |
| 5,099,152 A | 3/1992 | Suzuki | |
| 5,309,038 A | 5/1994 | Harada et al. | |
| 6,188,236 B1 | 2/2001 | Wikborg | |
| 6,452,520 B1 | 9/2002 | Smith et al. | |
| 6,507,234 B1 | 1/2003 | Johnson et al. | |
| 6,518,673 B2 | 2/2003 | Herr et al. | |
| 6,518,786 B2 | 2/2003 | Herr | |
| 6,549,059 B1 | 4/2003 | Johnson | |
| 6,580,310 B2 | 6/2003 | Herr | |
| 6,608,518 B2 | 8/2003 | Furuta et al. | |
| 6,617,643 B1 | 9/2003 | Goodwin-Johansson | |
| 6,678,540 B2 | 1/2004 | Wire et al. | |
| 6,724,216 B2 | 4/2004 | Suzuki et al. | |
| 6,750,794 B1 | 6/2004 | Durand et al. | |
| 6,777,808 B2 | 8/2004 | Herr et al. | |
| 6,836,141 B2 | 12/2004 | Herr | |
| 6,865,639 B2 | 3/2005 | Herr | |
| 6,900,454 B2 * | 5/2005 | Blais et al. ............. 257/14 |
| 6,909,109 B2 | 6/2005 | Herr | |

(Continued)

FOREIGN PATENT DOCUMENTS

EP  0 467 104 A2  1/1992

(Continued)

OTHER PUBLICATIONS

Gopalakrishnan, et al.: "Novel Very High IE Structures Based on the Directed BBHE Mechanism for Ultralow-Power Flash Memories". IEEE Electron Device Letters, vol. 26, No. 3, Mar. 2005; pp. 212-215.

(Continued)

*Primary Examiner* — Daniel D Chang
(74) *Attorney, Agent, or Firm* — Tarolli, Sundheim, Covell & Tummino LLP (57) ABSTRACT

Systems and methods are provided for performing a quantum gate operation. A first classical control parameter, configured to tune an associated frequency of a first qubit, is adjusted from a first value to a second value. The first value is selected such that the first qubit is tuned far from a characteristic frequency of an associated resonator, and the second value is selected such that the first qubit is tuned near to the characteristic frequency of the resonator. A second classical control parameter, configured to tune an associated frequency of a second qubit, is adjusted from a third value to a fourth value. The third value is selected such that the second qubit is tuned far from the characteristic frequency of the resonator. The first classical control parameter is returned to the first value. The second classical control parameter is returned to the third value.

22 Claims, 8 Drawing Sheets

U.S. PATENT DOCUMENTS

| | | | |
|---|---|---|---|
| 6,917,216 | B2 | 7/2005 | Herr |
| 6,960,780 | B2 | 11/2005 | Blais et al. |
| 7,135,701 | B2 | 11/2006 | Amin et al. |
| 7,170,960 | B2 | 1/2007 | Herr |
| 7,230,266 | B2 | 6/2007 | Hilton et al. |
| 7,437,533 | B2 | 10/2008 | Ichimura et al. |
| 7,447,719 | B2 | 11/2008 | Goto et al. |
| 7,498,832 | B2 * | 3/2009 | Baumgardner et al. .......... 326/7 |
| 7,541,198 | B2 | 6/2009 | Magnus et al. |
| 7,714,605 | B2 | 5/2010 | Baumgardner et al. |
| 7,724,020 | B2 | 5/2010 | Herr |
| 2006/0091490 | A1 | 5/2006 | Chen et al. |
| 2008/0291946 | A1 | 11/2008 | Malinovsky |
| 2009/0030962 | A1 | 1/2009 | Goto et al. |
| 2009/0078931 | A1 | 3/2009 | Berkley |
| 2009/0267635 | A1 | 10/2009 | Herr et al. |
| 2010/0044600 | A1 | 2/2010 | Ichimura et al. |

FOREIGN PATENT DOCUMENTS

| | | |
|---|---|---|
| WO | WO 2005/093649 A1 | 10/2005 |
| WO | WO 2009/039634 A1 | 4/2009 |

OTHER PUBLICATIONS

Choi, et al.: "*80nm Self-Aligned Complementary I-MOS Using Double Sidewall Spacer and Elevated Drain Structure and Its Applicability to Amplifiers with High Linearity*"; Electron Devices Meeting; Dec. 2004; pp. 8.5.1-8.5.4.

Choi, et al.: "*Novel Tunneling Devices with Multi-Functionality*"; Japanese Journal of Applied Physics; XP-001505882; vol. 46, No. 4B; Apr. 2007; pp. 2632-2625.

Toh, et al.: "*A Novel CMOS Compatible L-Shaped Impact-Ionization MOS (LI-MOS) Transistor*"; International Electron Devices Meeting; Dec. 2005; pp. 951-954.

Garanin, et al.: "*Effects of Nonlinear Sweep in the Landau-Zener-Stueckelberg Effect*"; Physical Review B; Nov. 2002; XP-002514571; vol. 66, No. 17; pp. 174438-1-174438-11.

Wulf, et al.: "*Dressed State of Josephson Phase Qubit Coupled to an LC Circuit*"; IEEE Transactions of Applied Superconductivity; XP-002514572; vol. 15, No. 2; Jun. 2005; pp. 856-859.

Berns, et al.: "*Coherent Quasiclassical Dynamics of a Persistent Current Qubit*"; Physical Review Letters; XP-002514573; vol. 97, No. 15; Oct. 2006; pp. 150502-1-150502-4.

Ortlepp, et al.: "*Experimental Analysis of a New Generation of Compact Josephson-Inductance-Based RSFQ Circuits*"; 11$^{th}$ International Superconductive Electronics Conference; Jun. 10, 2007; 3 pages.

Koch, et al.: "*A NRZ-Output Amplifier for RSFQ Circuits*", IEEE Transaction on Applied Superconductivity; vol. 9, No. 2; Jun. 1999, pp. 3549-3552.

* cited by examiner

| A IN | B IN | A OUT | B OUT |
|------|------|-------|-------|
| 0 | 0 | 0 | 0 |
| 0 | 1 | 1 | 0 |
| 1 | 0 | 0 | 1 |
| 1 | 1 | 1 | 1 |

FIG. 5

| Initial | A: A1→A2 | B: B1→B3 | A: A2→A1 | B: B3→B1 |
|---------|----------|----------|----------|----------|
| 0 | 0 | 0 | 0 | 0 |
| A | A − R | A + R | R | B |
| B | B | A − R | A | A |
| AB | AB − BR | AR − 2R | AR | AB |

| A IN | B IN | C IN | A OUT | B OUT | C OUT |
|---|---|---|---|---|---|
| 0 | 0 | 0 | 0 | 0 | 0 |
| 0 | 0 | 1 | 0 | 0 | 1 |
| 0 | 1 | 0 | 1 | 0 | 0 |
| 0 | 1 | 1 | 0 | 1 | 1 |
| 1 | 0 | 0 | 0 | 1 | 0 |
| 1 | 0 | 1 | 1 | 0 | 1 |
| 1 | 1 | 0 | 1 | 1 | 0 |
| 1 | 1 | 1 | 1 | 1 | 1 |

FIG. 11

| Initial | C1→C3 | A1→A2 | B1→B3 | A2→A1 | B3→B1 | C3→C1 |
|---|---|---|---|---|---|---|
| 0 | 0 | 0 | 0 | 0 | 0 | 0 |
| A | A | A − R | A + R | R | B | B |
| B | B | B | A − R | A | A | A |
| AB | AB | AB − BR | AR − 2R | AR | AB | AB |
| C | R | A + R | B | B | R | C |
| AC | AR | AR − 2R | AB − BR | AB | AR | AC |
| BC | BR | AB + BR | AR + 2R | 2R | BR | BC |
| ABC | ABR | ABR−B2R | A2R−3R | A2R | ABR | ABC |

| A IN | B IN | C IN | A OUT | B OUT | C OUT |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 1 | 0 | 1 |
| 1 | 0 | 0 | 1 | 0 | 0 |
| 1 | 0 | 1 | 0 | 1 | 1 |
| 1 | 1 | 0 | 1 | 1 | 0 |
| 1 | 1 | 1 | 1 | 1 | 1 |

FIG. 16

QUANTUM LOGIC GATES UTILIZING RESONATOR MEDIATED COUPLING

BACKGROUND OF THE INVENTION

1. Field of the Invention

The invention relates generally to quantum logic gates. More specifically, the invention relates to quantum logic gates utilizing resonator mediated coupling.

2. Background of the Invention

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g. high voltage) or a logical zero (e.g. low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability means that a quantum computer can solve a large class of problems with exponentially greater efficiency than that of a classical computer.

SUMMARY OF THE INVENTION

In accordance with an aspect of the present invention, a method is provided for performing a quantum gate operation. A first classical control parameter, configured to tune an associated frequency of a first qubit, is adjusted from a first value to a second value. The first value is selected such that the first qubit is tuned to a first frequency far from a characteristic frequency of an associated resonator and the second value is selected such that the first qubit is tuned to a second frequency near to the characteristic frequency of the resonator. A second classical control parameter, configured to tune an associated frequency of a second qubit, is adjusted from a third value to a fourth value. The third value is selected such that the second qubit is tuned to a frequency far from the characteristic frequency of the resonator. The first classical control parameter is returned to the first value. The second classical control parameter is returned to the third value.

In accordance with another aspect of the present invention, a method for performing a Fredkin gate operation utilizing resonator mediated coupling is provided. A first classical control parameter, configured to tune an associated frequency of a first qubit, is adjusted from a first value to a second value. The first value is selected such that the first qubit is tuned to a first frequency far from a characteristic frequency of an associated resonator, and the second value is selected such that the first qubit is tuned to a second frequency far from the characteristic frequency of the resonator. A second classical control parameter, configured to tune an associated frequency of a second qubit, is adjusted from a third value to a fourth value. The third value is selected such that the second qubit is tuned to a third frequency far from the characteristic frequency of the resonator, and the fourth value is selected such that the second qubit is tuned to a fourth frequency near to the characteristic frequency of the resonator. A third classical control parameter, configured to tune an associated frequency of a third qubit, is adjusted from a fifth value to a sixth value. The fifth value is selected such that the third qubit is tuned to a fifth frequency far from the characteristic frequency of the resonator. The second classical control parameter is returned to the third value, the third classical control parameter is returned to the fifth value, and the first classical control parameter is returned to the first value.

In accordance with yet another aspect of the present invention, a quantum logic gate is provided. A first qubit is coupled to a resonator with a first coupling strength, and a second qubit coupled to the resonator with a second coupling strength. The second coupling strength is greater than the first coupling strength. A first classical control mechanism is coupled to the first qubit and configured to tune an associated frequency of the first qubit. A second classical control mechanism is coupled to the second qubit and configured to tune an associated frequency of the second qubit.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

The present invention provides a novel technique for creating fundamental logic gates in a quantum circuit utilizing resonator mediated coupling. In a quantum circuit in accordance with an aspect of the present invention, at least two qubits are coupled to a common resonator, but are not directly coupled to one another. This technique allows the logic gates, or quantum gates, to be controlled in a highly accurate manner by classical digital control. The control is "digital" in the sense that the starting point, ending point, and speed of the control signal do not require high precision to achieve a high degree of accuracy in the response of the quantum gates. By eliminating the need for high precision electronic controls, the invention significantly reduces the cost and complexity of quantum computing and makes possible the engineering of a quantum computer.

Figure 1:
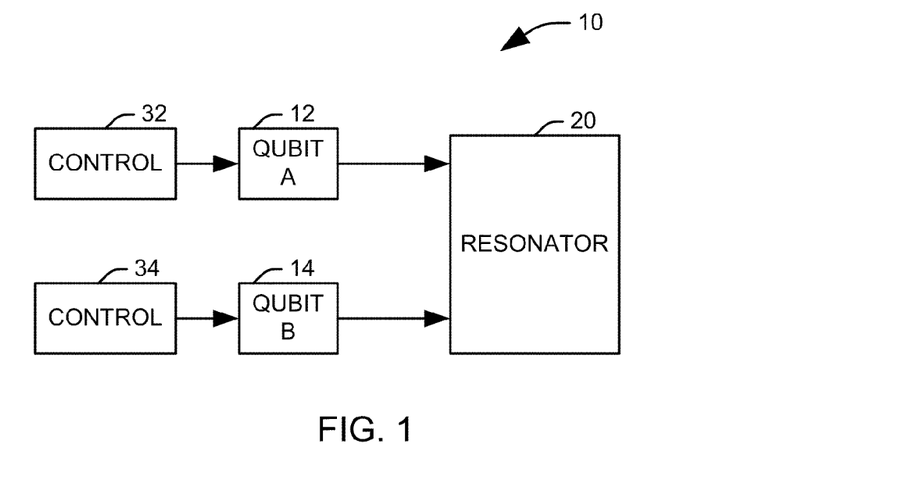
FIG. 1 illustrates a functional block diagram of a first exemplary implementation of a quantum circuit according to an aspect of the present invention.

FIG. 1 illustrates a functional block diagram of a first exemplary implementation quantum circuit 10 according to an aspect of the present invention, which includes a plurality of qubits 12 and 14 configured to interact with a common fixed resonator 20 to perform a logical operation. To this end, each of the plurality of qubits 12 and 14 is coupled to, and is controllable by, a corresponding digital classical control mechanism 32 and 34, such that a frequency of a given qubit (e.g., 12) can be tuned by its corresponding classical control mechanism (e.g., 32). The term "classical" implies that the manner of control behaves generally according to the laws of classical physics. In one implementation, the resonator 20 can have an associated frequency o in the range of four to twenty gigahertz, and each of the first and second classical control mechanisms 32 and 34 are configured to tune the qubits 12 and 14 with a frequency band of several hundred megahertz around the frequency of the resonator, such that the frequency band has a width less than one gigahertz.

It will be appreciated that the plurality of qubits 12 and 14 can be implemented as a Josephson junction, a quantum dot, a SQUID (superconducting quantum interference device), a Cooper pair box, or an ion trap. Similarly, the resonator 20 can comprise any system having at least two quantum states. For example, the resonator 20 can be implemented as a transmission line, a resonant cavity, or another qubit. In addition, the coupling of a qubit to a resonator may be accomplished according to the invention using any of various means of physical coupling. For example, the qubit-resonator coupling may be an electrical coupling by means of an electrical conductor. Alternatively, the qubit-resonator coupling may include, without limitation, mechanical, capacitive, inductive, magnetic, nuclear, and optical coupling, or any combination thereof.

To best introduce the operating principles of the invention, it is instructive to present the concept of an "avoided crossing" of energy states. This concept is illustrated in the context of the energy diagram of FIG. 2, which shows the energy states of the two qubits 12 and 14 and the resonator 20 in a substantially uncoupled state, and the energy diagram of FIG. 3, which shows the energy states of a system as described in FIG. 1, in which each of the two qubits 12 and 14 is coupled to the resonator 20. For ease of reference, such a system will be referred to hereinafter as a qubit-resonator-qubit system. Further, the terms "sweep" and "jump" are useful to a shorthand descriptions of adjustments to the classical control parameters having a rate relative to an energy (e.g., a spacing between two energy states) of the qubit-resonator-qubit system. A jump is a rapid adjustment of the control parameter that causes the frequency of the qubit to change at a rate much faster than the system can respond. In a jump operation, the quantum state of the system is left undisturbed but the Hamiltonian, and thus the energy spectrum, changes. A sweep operation is a slow change of the control parameter, which allows the system sufficient time to respond. The system adjusts adiabatically, preserving the energy eigenstates of the system.

Further, to facilitate explanation of the systems and methods of the present invention, this application utilizes a shorthand notation to describe the energy states of the qubits and resonator. For example, we use the symbol 0 to represent the ground state, $0 \Leftrightarrow |0,g,g\rangle$. The symbol A represents the excited state of qubit A, $A \Leftrightarrow |0,e,g\rangle$. Likewise, the symbol B represents the excited state of qubit B, $B \Leftrightarrow |0,g,e\rangle$, while the symbol R represents a single photon in the resonator, $R \Leftrightarrow |1,g,g\rangle$. States with multiple photons in the resonator are represented by prefixing the symbol R with a number. For example 3R represents the state $|3,g,g\rangle$. States with one or more photons in the resonator and some combination of excitations in the qubits are written by prefixing the appropriate resonator state symbol with the letter A and B as appropriate. For example A2R represents the state $|2,e,g\rangle$ while ABR represents the state $|1,e,e\rangle$. Finally, linear superpositions of the basis states are represented by the appropriate linear combination of symbols, where the state normalization is assumed. For example A−R represents the state $$\frac{1}{\sqrt{2}}|0,e,g\rangle - \frac{1}{\sqrt{2}}|1,g,g\rangle$$

while 0+2 AB represents the state $$\frac{1}{\sqrt{s}}|0,g,g\rangle + \frac{2}{\sqrt{s}}|0,1,1\rangle.$$

Figure 2:
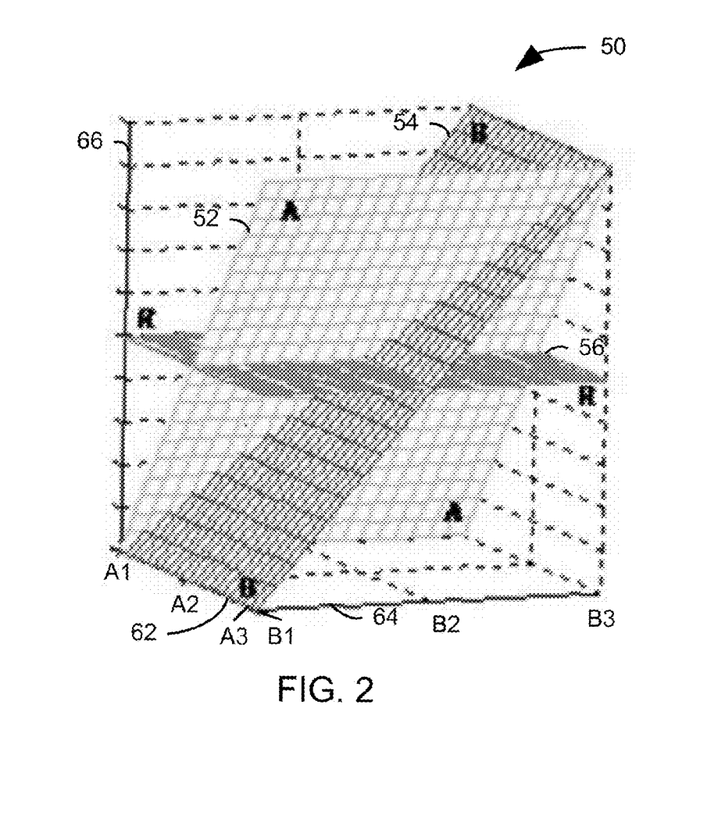
FIG. 2 illustrates a first energy diagram illustrating a plurality of energy contours representing energy states of a system having two qubits and a resonator with no coupling between the qubits and the resonator.

FIG. 2 illustrates a first energy diagram 50 illustrating a plurality of energy contours 52, 54, and 56 representing energy states of a system having two qubits, designated as A and B, and a resonator with no coupling between the qubits and the resonator as functions of a first classical control parameter associated with the first qubit and a second classical control parameter associated with the second qubit. It will be appreciated that FIG. 2 represents an ideal case shown only for the purposes of illustration. In any practical system, some amount of coupling will exist between the qubit and resonator. Accordingly, in the ideal case shown, changes in energy state of the qubit are independent of changes in energy state of the resonator. It will be appreciated that each classical control mechanism is configured to vary among a range of values. A first axis 62 of the energy diagram represents the value of a first classical control parameter associated with the first qubit, and a second axis 64 represents the value of a second classical control parameter associated with the second qubit. A third axis 66 represents an energy of the system formed by the resonator and the two qubits. For the purpose of the illustrated diagram, the first axis 62 and the second axis 64 are depicted on the same scale, such that the values denoted as A1, A2, and A3, are substantially equal in magnitude to the values denoted as B1, B2, and B3.

In FIG. 2, because there is no coupling between the qubit and resonator, energy levels simply add together, and the energy states can cross. For example, a first energy contour 52 represents an excited state of the first qubit (A), a second energy contour 54 represents an excited state of the second qubit (B), and a third energy contour 56 represents an excited state of the resonator (R). It will be appreciated that an associated energy of the A state is a function solely of the first classical control parameter, an associated energy of the B state is a function solely of the second classical control parameter, and a third energy state is independent of both classical control parameters. As a result, as illustrated by the energy contours 52, 54, and 56, the excited states of the first qubit and the resonator are degenerate when the value of the first classical control parameter is equal to a given value, denoted as A2 on the energy diagram. Similarly, the excited states of the second qubit and the resonator are degenerate when the value of the second classical control parameter is equal to a given value, denoted as B2 on the energy diagram, and the excited states of the first qubit and the second qubit are degenerate when the values of the first and second classical control parameters are equal. It will be appreciated that all three excited states are degenerate when the first classical control parameter is set to A2 and the second classical control parameter is set to B2.

Figure 3:
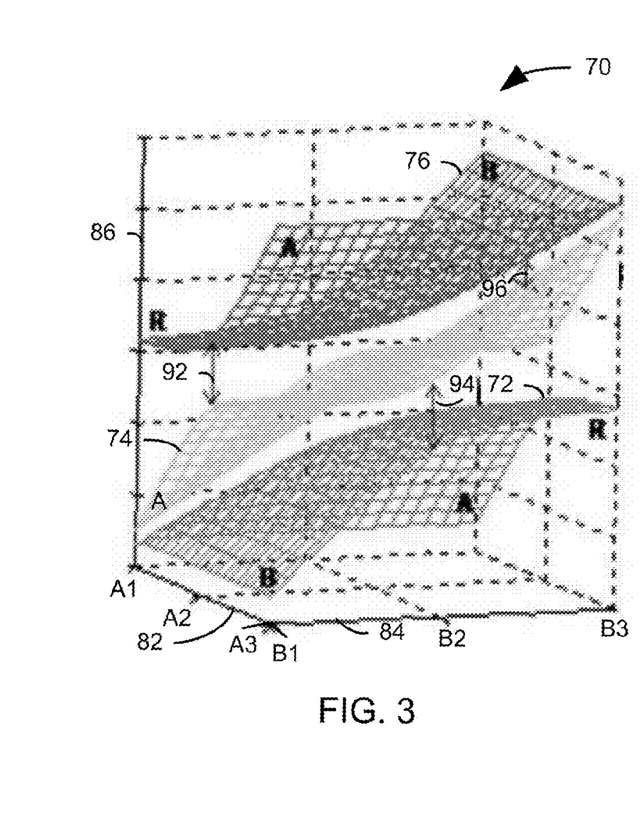
FIG. 3 illustrates a second energy diagram illustrating a plurality of energy contours representing energy states of a system exhibiting substantial coupling between each of a first qubit and a second qubit with a common resonator.

FIG. 3 illustrates a second energy diagram 70 illustrating a plurality of energy contours 72, 74, and 76 representing energy states of a system exhibiting substantial coupling between each of a first qubit, denoted herein as qubit A, and a second qubit, denoted herein as qubit B, with a common resonator as functions of a first classical control parameter associated with the first qubit and a second classical control parameter associated with the second qubit. For brevity, such a system is referred to hereinafter as a qubit-resonator-qubit system. Similarly to FIG. 2, a first axis 82 of the energy diagram represents the value of the first classical control parameter, and a second axis 84 represents the value of the second classical control parameter, and a third axis 86 represents an energy of the system formed by the resonator and the two coupled qubits. Further, for the purpose of the illustrated diagram, the first axis 82 and the second axis 84 are depicted on the same scale, such that the values denoted as A1, A2, and A3, are substantially equal in magnitude to the values denoted as B1, B2, and B3. It will be appreciated that, while the illustrated energy diagram 70, is provided to facilitate explanation of the systems and methods presented herein, any of a number of quantum logic gates can be implemented with a system represented by the diagram.

In the illustrated diagram, a first energy contour 72 represents a first excited state of the qubit-resonator-qubit system, a second energy contour 74 represents a second excited state of the qubit-resonator-qubit system, and a third energy contour 76 represents a third excited state of the qubit-resonator-qubit system. It will be appreciated that the qubit-resonator-qubit system can include additional energy eigenstates, including at least a ground state of the system. The ground state of the system is not illustrated in FIG. 3, but would be represented as a plane having a constant energy well below the scale illustrated in FIGS. 2 and 3. Similarly, the qubit-resonator-qubit system can include a fourth excited state that is separated from the third excited state by a significant energy gap, and would be represented as a contour with an energy significantly above the scale illustrated in FIGS. 2 and 3.

In accordance with an aspect of the present invention, a quantum circuit can be configured to exploit a resonator mediated coupling between the two qubits. As can be seen from FIG. 3, when the qubits are tuned near the resonator, the resonator produces an effective coupling between the two qubits that creates an avoided crossing between the respective excited states of the two qubits. When the qubits are tuned far from the resonator, this avoided crossing disappears and the excited states of the qubits are degenerate. It will be appreciated that FIG. 3 is slightly exaggerated to emphasize the avoided crossing of the two states, and that if the upper and lower bounds of the classical control parameters are chosen to be sufficiently far from A2 and B2, the avoided crossing will effectively disappear. When this is the case, sweeping into the point A1, B1 along the first axis 82 transitions the first excited state 72 into the B state while sweeping into the point A1, B1 along the second axis 84 transitions the first excited state into the A state Likewise, sweeping into the point A1, B1 along the first axis 82 transitions the second excited state 74 into the A state while sweeping into the point A1, B1 along the second axis 84 transitions the second excited state into the B state.

In reality, the avoided crossing between the excited states never disappears completely no matter how far the qubits are detuned from the resonator. However, the avoided crossing can be made arbitrarily small. If we define $\Delta$ as the smaller of the energy difference between the A and R states and the energy difference between B and R states, then the size of the avoided crossing between the A and B states will decrease as $1/\Delta$ for a sufficiently large $\Delta$. Thus if A1 and B1 are chosen sufficiently far from A2 and B2, the size of the avoided crossing can be made sufficiently small that a fixed rate for adjusting the classical control parameters can result in an adiabatic sweep near A2, B2 while causing a jump near A1, B1.

Figure 4:
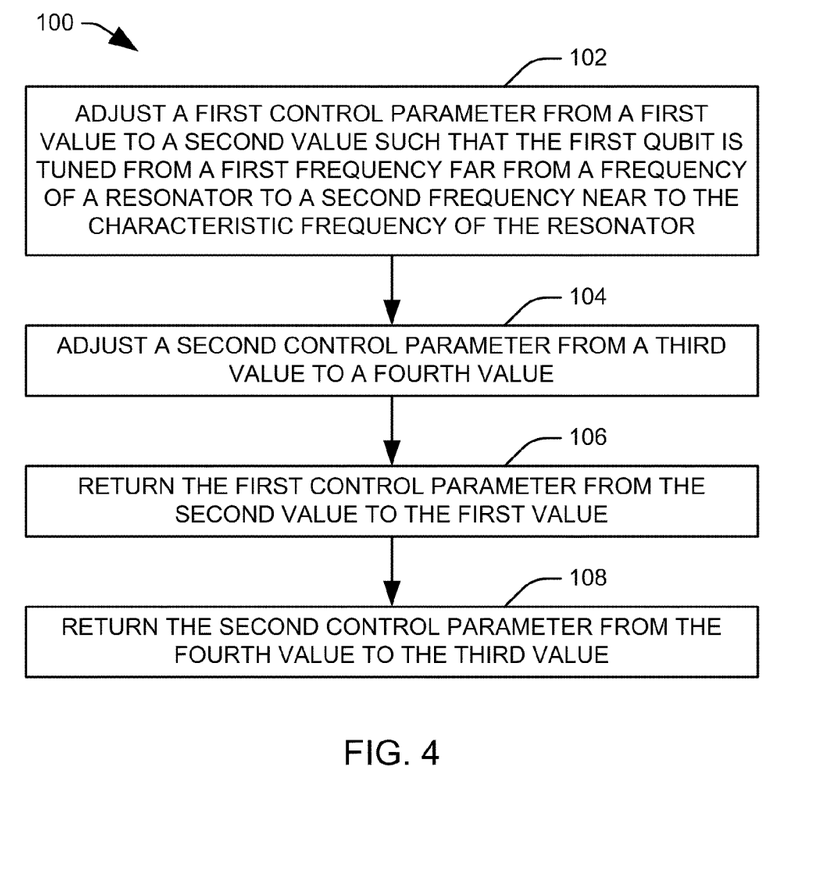
FIG. 4 illustrates an exemplary method for implementing a quantum swap gate with a quantum circuit in accordance with an aspect of the present invention.
Figure 5:
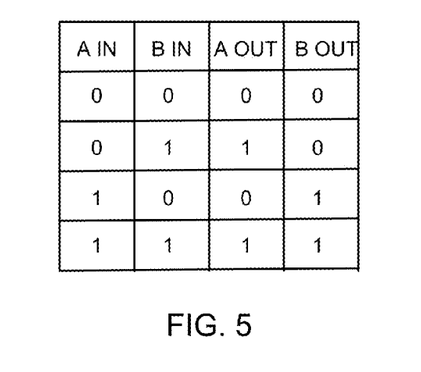
FIG. 5 illustrates a truth table describing the swap gate operation.

FIG. 4 illustrates an exemplary method 100 for implementing a quantum swap gate with a quantum circuit in accordance with an aspect of the present invention. A truth table describing the swap gate operation is illustrated as FIG. 5. The quantum circuit includes a first classical control mechanism configured to tune an associated frequency of a first qubit and a second classical control mechanism configured to tune an associated frequency of a second qubit, wherein each of the first and second qubits are coupled to a resonator by a coupling having a characteristic energy. For the purposes of the illustrated method, it is assumed that the strength of the coupling between the first qubit and the resonator is substantially equal to a strength of the coupling between the second qubit and the resonator, but it will be appreciated that the method is fairly robust and will tolerate significant variation in coupling strengths. For example, the illustrated method 100 would function equally well if the strength of the coupling between the first qubit and the resonator was fifty percent greater than the strength of the coupling between the second qubit and the resonator.

In the illustrated method 100, it is assumed that the energy levels of a given coupled qubit-resonator pair within the quantum circuit can be represented by the energy diagram of FIG. 3 and that the resonator begins in its lowest energy state. Further, the value of the first classical control parameter and the second classical control parameter are initialized to respective start values, such that each of the first qubit and the second qubit are tuned relatively far from a characteristic frequency of the resonator. By "relatively far from the characteristic frequency of the resonator," it is meant that a given qubit is sufficiently detuned from the resonator such that the effective of the qubit-resonator coupling on the excited state of the qubit is minimal. For example, referring to FIG. 3, appropriate initial values could include (A1, B1) and (A3, B3). At these values, it will be appreciated that transitioning the system through the crossing at the selected rate would result in a jump operation, defined as a rapid adjustment of the control parameter that causes the frequency of the qubit to change at a rate much faster than the system can respond. In a jump operation, the quantum state of the system is left undisturbed but the Hamiltonian, and thus the energy spectrum, changes.

Accordingly, at 102, the first classical control parameter is adjusted from a first value to a second value. For example, the first value can represent an appropriate initial value as discussed above, such as A1. At 104, the second classical control parameter is adjusted from a third value to a fourth value. Again, the third value can represent an appropriate initial value as discussed above, such as B1. It will be appreciated that the adjustments of 102 and 104 can occur simultaneously, in sequence, or during overlapping but non-coincident periods of time. In accordance with an aspect of the present invention, the second and fourth values can be selected such that, if the qubit-resonator-qubit system begins in an appropriate state, the system is transitioned through an avoided crossing of an excited state of the first qubit and an excited state of the second qubit. It will be appreciated that a maximum size of the avoided crossing exists when both first qubit and the second qubit are tuned to be near the characteristic frequency of the resonator, and thus the second value and the fourth value are selected to provide such a tuning during the adjustment of the classical control parameters of 102 and 104. To this end, referring again to FIG. 3, the second value and the fourth value can be selected such that, at some point during the adjustment, the first classical control parameter is at the value represented as A2 at the same time that the second classical control is at the value represented as B2. For example, the second value can be A2 and the fourth value can be B3.

At 106, the first classical control parameter is adjusted to return from the second value to the first value. At 108, the second classical control parameter is adjusted to return from the second value to the first value. Again, it will be appreciated that the adjustments of 106 and 108 can occur simultaneously, in sequence, or during overlapping but non-coincident periods of time. In accordance with an aspect of the present invention, the adjustments of 106 and 108 can be performed such that the system is not transitioned through the avoided crossing of the excited states of the qubits. In other words, viewing the adjustment of the classical control parameters in 102, 104, 106, and 108 as a trace along a two-dimensional plane having axes defined by the control parameters, the adjustments of 102 and 104 do not follow the same path as the adjustments of 106 and 108, such that the trace forms a closed loop. Once the classical control parameters have been returned to their initial values, the quantum swap operation is completed.

Figure 6:
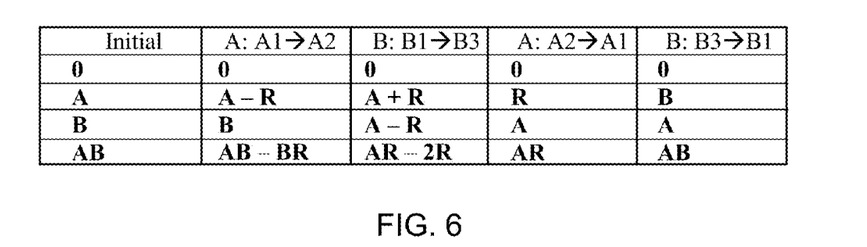
FIG. 6 illustrates a table of state transitions associated with an exemplary implementation of the quantum swap operation of FIG. 4.

The function of the swap operation of FIG. 4 is best understood via a simplified example. To this end, FIG. 6 illustrates a table of state transitions associated with an exemplary implementation of the quantum swap operation of FIG. 4. In performing the swap operation, it will be appreciated that the method will begin with the system in one of the four states 0, A, B, or AB or a linear combination thereof. In this exemplary implementation, it is assumed that the adjustments of 102, 104, 106, and 108 occur sequentially, and, referencing FIG. 3, the first classical control parameter is adjusted from A1 to A2 at 102, the second classical control parameter is adjusted from B1 to B3 at 104.

It will be appreciated that the ground state, 0, of the qubit-resonator-qubit system is separated from the other energy states by a significant gap, and is thus non-degenerate over the allowed ranges of the first and second classical control parameters. Accordingly, if the system begins in the ground state, that is, if the first qubit and the second qubit begin the method 100 in their respective ground states, adjusting the control parameters at a rate selected to cause an adiabatic sweep through the avoided crossing formed by the resonator mediated coupling of the two qubits will not cause a change in the energy state of the system, as the system remains in the ground state throughout the method. It will be appreciated that this also holds true when the system begins in a linear superposition of states including the ground state, such that the portion of the superposition in the ground state will be unaffected by the swap operation.

Since the second control parameter is held constant at a point B1 during the adjustment of the first control parameter from A1 to A2, the state B is unaffected. However, a system in state A will follow the contour 74 representing the second excited state of the system and transform from state A to state A–R. During the adjustment of the second classical control parameter from B1 to B3, A system in the A–R state remains in the second excited state, which is transformed into the A+R state, while a system in the B state follows the contour 72 representing the first excited state and transform into the A–R state. When the first classical control parameter is swept from A2 back to A1, the A+R state is transformed into the R state while the A–R state is transformed into the A state. Finally, when the second classical control parameter is returned to B1 from B3, the A state is unchanged, and the R state is transformed into the B state. Accordingly, if the system begins in the A state, it ends in the B state, and if the system begins in the B state, it ends in the A state, as would be expected in a swap operation.

Figure 7:
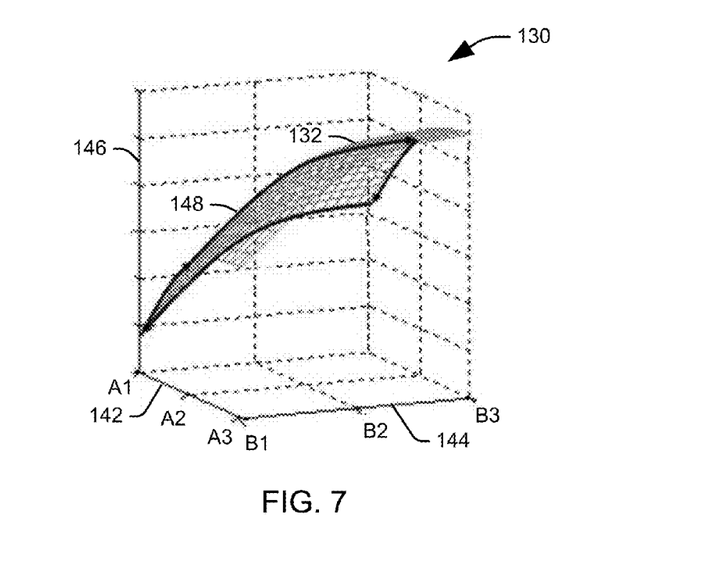
FIG. 7 illustrates an energy diagram of a contour representing the fourth excited state of the qubit-resonator-qubit system.

If the qubit-resonator-qubit system begins in the AB state, that is, if both the first qubit and the second qubit begin the method 100 in their respective excited states, the state of the system does not change. At the initial values (e.g., A1, B1) of the classical control parameter, the AB state corresponds to a fourth excited state of the qubit-resonator-qubit system. FIG. 7 illustrates an energy diagram 130 of a contour 132 representing the fourth excited state of the qubit-resonator-qubit system as a function of the first classical control parameter, represented on a first axis 142 and the second classical control parameter, represented on a second axis 144, with a third axis 146 representing energy. As mentioned previously, there is a large gap between the fourth excited state and any other energy states of the system, such that under an adiabatic sweep operation, the system will remain in the fourth excited state, even though the basis states that constitute the fourth excited state change. Thus, the adjustments of 102, 104, 106, and 108 form a closed loop 148 on the contour 132, with the first sweep transforming the initial state AB into the state AB–BR. The second sweep transforms the state AB–BR into the state AR–2R. The third sweep transforms the state AR–2R into the state AR, and the final sweep transforms the state AR back into the initial state AB. The net effect of the SWAP operation is to leave the AB state undisturbed.

It will be appreciated that the implementation described in FIG. 6 is merely exemplary, and that a method in accordance with the present invention can vary significantly from this example. For example, the order in which the qubits are adjusted is irrelevant, so long as the system passes through the avoided crossing, such that the operation could start by sweeping control parameter B from B1 to B2, then sweep control parameter A from A1 to A3, etc. Similarly, both qubits could start at any point at which they are tuned far from the resonator and yield the same result. The endpoints of the first two adjustments need not be chosen to make the energy of state A exactly equal to the energy of state R. If the endpoints are chosen such that qubit A is detuned slightly from the resonator, a SWAP gate will still be obtained, but the intermediate states used will differ slightly from A+B and A–B and it will be necessary to sweep slower to obtain the same gate fidelity. Finally, it is possible to obtain the same SWAP operation by sweeping both control parameters simultaneously.

Figure 8:
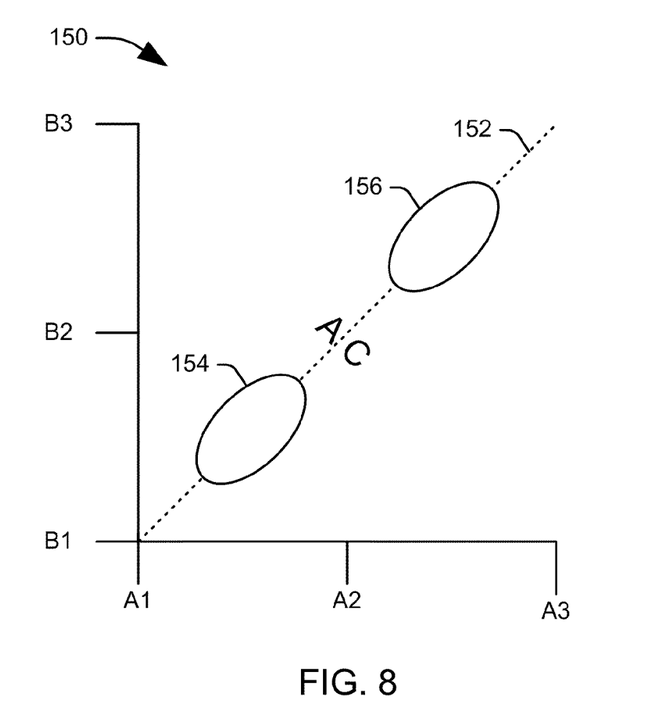
FIG. 8 illustrates a graphical depiction of the behavior of the system when the method of FIG. 4 begins in the A or B state.

FIG. 8 illustrates a graphical depiction 150 of the behavior of the system when the method of FIG. 4 begins in the A or B state. For example, the avoided crossing created by the resonator mediated coupling between the first and second qubits has a certain minimum size when the qubits are tuned near the resonator, such as in the vicinity of the point A2, B2 in FIG. 8. It is therefore possible to find a sweep rate for varying the control parameters that always results in an adiabatic sweep preserving the energy state of the system for any variations of the control parameter near A2, B2. Similarly, when the control parameters are substantially unequal, the energy differences between the states are at least as large as in the vicinity of A2, B2, such that adjustments of the control parameters at the same sweep rate still results in an adiabatic sweep of the system. However, it will be possible to find values of A1, B1 such that the avoided crossing between A and B is small and sweeping at the same rate in the vicinity of A1, B1 can result in a jump across the tiny avoided crossing.

A dashed line 152 in FIG. 8 indicates points where states A and B are degenerate. A region near A2, B2 is labeled with AC, indicating a region at which the avoiding crossing is of a sufficient size to ensure an adiabatic sweep at a selected rate of transition. If the rate at which the control parameters are adjusted is chosen so as to yield an adiabatic sweep in this region, it will also produce an adiabatic sweep in the regions away from the dashed line. The ovals 154 and 156 indicate regions in which high fidelity gates cannot be performed. If control parameters are adjusted at the same rate in either the region near A1, B1 or the region near A3, B3 and are adjusted in a direction that is not parallel to the dashed line, the state will jump over the avoided crossing. For example, the control parameter is adjusted in the vicinity of point A1, B1, a state initially on the first energy contour 72 illustrated in FIG. 3 will jump to the second energy contour 74 upon crossing the dashed line. Likewise, a state on the second energy contour 74 will jump to the first energy contour 72. Accordingly, in accordance with an aspect of the present invention, the transitions of 102, 104, 106, and 108 in the method of FIG. 4 can all be performed at a constant rate of transition.

Accordingly, the SWAP operation illustrated in FIG. 4 can be implemented by picking any starting point with the first and second control parameters substantially equal and tuned far from the resonator (e.g., A1, B1 or A3, B3). In these regions 0, A, B, and AB are essentially energy eigenstates of the system. The control parameters are then adjusted so as to trace a closed loop around one of the ovals 154 and 156 in FIG. 8. When passing through the avoided crossing near the resonator or at a point away from the region in which the states are degenerate 152, the states transition adiabatically. When circling around one of the ovals 154 and 156 in the regions of degeneracy far from the resonator (e.g., around A1, B1 or A3, B3), a jump operation will occur. So long as exactly one jump operation is performed, for example, by sweeping around one and only one of the ovals (e.g., 154), the A and B states will be exchanged upon returning to the initial point. As described above, the fourth excited state is well separated from all other states. Thus as the control parameters are adjusted, the AB state may make many transformations, but upon returning to the initial point will return to the state AB. Similarly, the ground state is well separated from the excited states and unaffected by the transitions. Thus, any adjustment of the first and second classical control parameters that create a closed loop around one of the ovals 154 and 156 indicated in FIG. 8 will perform a SWAP gate between qubits A and B.

One advantage of the method of FIG. 4 is that the qubit frequency only needs to be tuned over a band that is a few times larger than the coupling to the resonator, as opposed to, for example, a range that was more than double the resonator frequency. For example, if the resonator has a characteristic frequency of six GHz, and the qubits are coupled to the resonator with a coupling of one hundred MHz, then the method of FIG. 4 only requires that the qubits be tuned over a frequency range of a few hundred megahertz. In addition, the illustrated method 100 does not require state transitions that are the product of multiple photon processes. Such processes are only possible in highly non-linear systems, and avoided crossings based on these processes are typically much smaller than avoided crossings based on the single photon processes of FIG. 4, such that the illustrated method provides significant tolerance to error.

Figure 9:
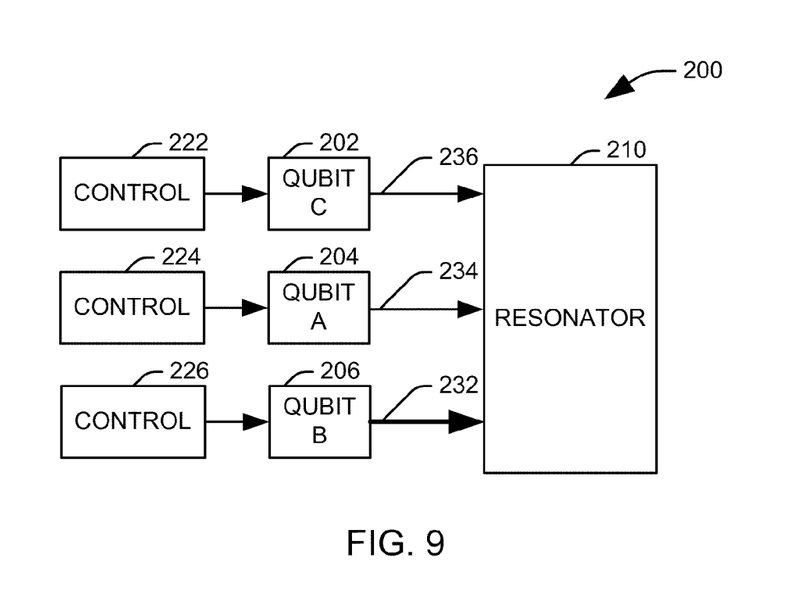
FIG. 9 illustrates a functional block diagram of a second implementation of a quantum circuit according to an aspect of the present invention.

FIG. 9 illustrates a functional block diagram of a second implementation of a quantum circuit 200 according to an aspect of the present invention, which includes a plurality of qubits 202, 204, and 206 configured to interact with a common fixed resonator 210 to perform a logical operation. To this end, each of the plurality of qubits 202, 204, and 206 is coupled to, and is controllable by, a corresponding digital classical control mechanism 222, 224, and 226, such that a frequency of a given qubit (e.g., 202) can be tuned by its corresponding classical control mechanism (e.g., 222). It will be appreciated that the plurality of qubits 202, 204, and 206 can be implemented as a Josephson junction, a quantum dot, a SQUID (superconducting quantum interference device), a Cooper pair box, or an ion trap. Similarly, the resonator 210 can comprise any system having at least two quantum states. For example, the resonator 210 can be implemented as a transmission line, a resonant cavity, or another qubit. In addition, the coupling of a qubit to a resonator may be accomplished according to the invention using any of various means of physical coupling. For example, the qubit-resonator coupling may be an electrical coupling by means of an electrical conductor. Alternatively, the qubit-resonator coupling may include, without limitation, mechanical, capacitive, inductive, magnetic, nuclear, and optical coupling, or any combination thereof.

In accordance with an aspect of the present invention, a first coupling 232 between a third qubit 206 of the plurality of qubits 202, 204, and 206 and the resonator 210 can be configured to be significantly stronger than second and third couplings 234 and 236 between the second and first qubits 204 and 202 and the resonator. For example, if the qubit-resonator coupling is provided by means of an inductor, an associate inductance of an inductor associated with the first coupling 232 can be smaller than the inductance of inductors associated with the second and third couplings 234 and 236. Similarly, if the qubit-resonator coupling is capacitive, a capacitor associated with the first coupling 232 can be configured to have a larger capacitance than that of capacitors associated with the second and third couplings 234 and 236. In one implementation, the coupling 232 between the third qubit 206 and the resonator 210 can be fifty percent greater than the couplings 234 and 236 between the second and first qubits 204 and 202 and the resonator.

Figure 10:
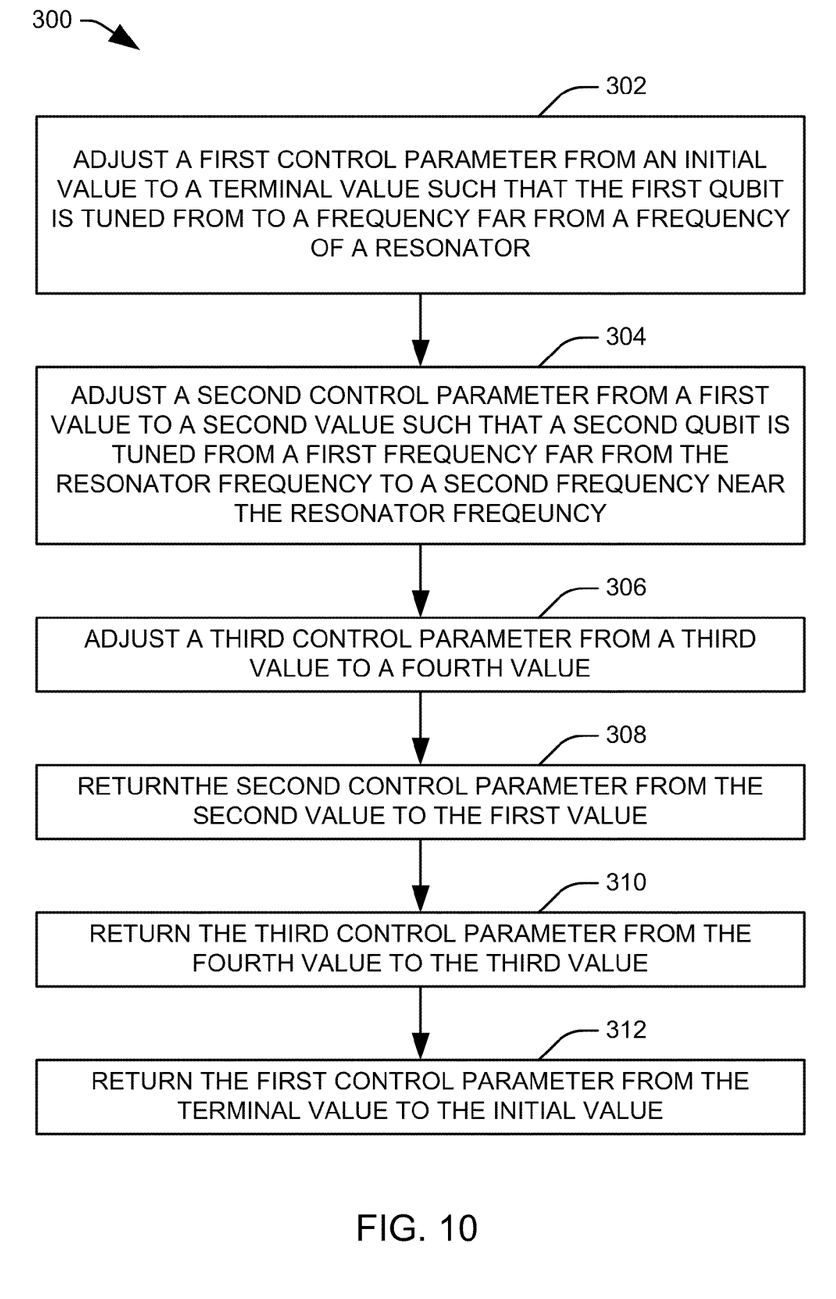
FIG. 10 illustrates a method for performing an inverse Fredkin gate in accordance with an aspect of the present invention.
Figure 11:
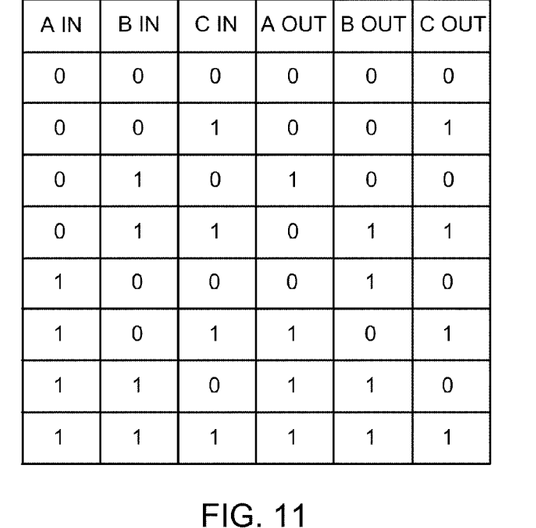
FIG. 11 illustrates a truth table describing the inverse Fredkin gate operation.

In accordance with an aspect of the present invention, the quantum circuit 200 of FIG. 9 can be utilized to perform a Fredkin gate operation, which is a swap of the associated states of the second and third qubits controlled by the first qubit. Specifically, the associated states of the second qubit and the third qubit are swapped only if the first qubit begins the operation in an excited state. To this end, FIG. 10 illustrates a method 300 for performing an inverse Fredkin gate in accordance with an aspect of the present invention. By an "inverse Fredkin gate," it is meant that the swap operation is controlled by a control qubit, but that a swap takes place when the control qubit begins the gate operation in a ground state. A truth table for the inverse Fredkin gate is provided as FIG. 11, with the qubit designed as C controlling the swap of the states of the qubits designed as A and B.

At 302, a first classical control parameter, associated with the first qubit, is adjusted from an initial value to a terminal value, which is selected such that the first qubit, at the end of the adjustment, is tuned far from the resonator. Further, the initial and terminal values are selected such that, if the first qubit is in the excited state, a photon is transferred to the resonator from the first qubit (i.e., the first qubit falls to the ground state and the resonator enters the first excited state). At 304, the second classical control parameter is adjusted from a first value, selected such that the second qubit is tuned far from the resonator, to a second value, in which the second qubit is tuned to be near the characteristic frequency of the resonator. At 306, the third classical control parameter is adjusted from a third value, selected such that the third qubit is tuned far from the resonator, to a fourth value, such that during the adjustment, the third qubit is tuned to be near the resonator. It will be appreciated that the adjustments of 304 and 306 can occur simultaneously, in sequence, or during overlapping but non-coincident periods of time.

At 308, the second classical control parameter is returned from the second value to the first value. At 310, the third classical control parameter is returned from the fourth value to the third value. Again, it will be appreciated that the adjustments of 308 and 310 can occur simultaneously, in sequence, or during overlapping but non-coincident periods of time. At 312, the first classical control parameter is returned from the terminal value to the initial value. During the transition of 312, if the resonator is in its first excited state, it returns to a ground state and the first qubit enters an excited state. Once each of the classical control parameters have been returned to their initial values, the inverse Fredkin gate operation is completed.

Figure 12:
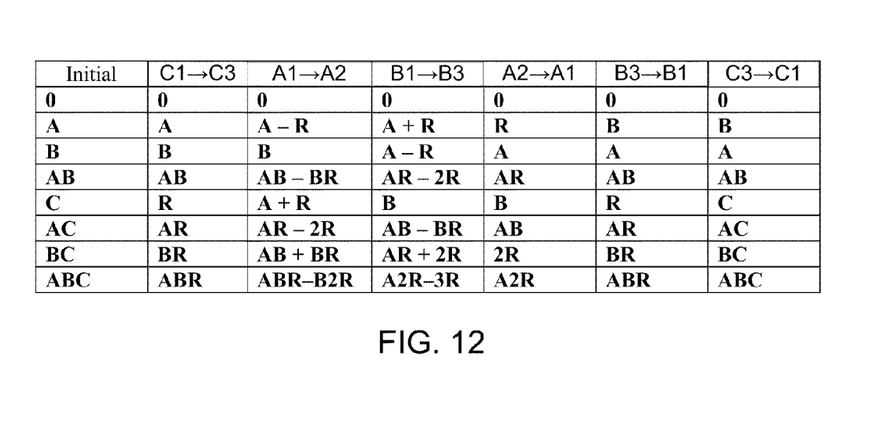
FIG. 12 illustrates a table of state transitions associated with an exemplary implementation of the inverse Fredkin gate operation of FIG. 10.

The function of the inverse Fredkin gate operation of FIG. 10 is best understood via a simplified example. To this end, FIG. 12 illustrates a table of state transitions associated with an exemplary implementation of the inverse Fredkin gate operation of FIG. 10. In performing the swap operation, it will be appreciated that the method will begin with the system in one of the eight states 0, A, B, C, AB, AC, BC, or ABC or a linear combination thereof. It will be appreciated that the unequal coupling of the second and third qubits (A and B) has a minimal effect on the first, second, and third excited states of the system. Accordingly, the energy diagram depicted in FIG. 3 is illustrative in determining the behavior of the system within the states. In this exemplary implementation, it is assumed that the adjustments of 302, 304, 306, 308, 310, and 312 occur sequentially, and, referencing FIG. 3, the second classical control parameter is adjusted from A1 to A2 at 304, and the third classical control parameter is adjusted from B1 to B3 at 306. Initial and final values for the first classical control parameter are referred to as C1 and C3.

Where the control qubit, C, begins in the ground state, the system begins in one of the 0, A, B, and AB states, and the various adjustments of the classical control parameters are substantially identical to those performed in the method of FIG. 4. Accordingly, the state transitions of the system in these states are equivalent to the transitions described in FIG. 6 and the accompanying text. An explanation of those transitions is omitted here for the sake of brevity, but it will be appreciated that, where the control qubit is in the ground state, the method of FIG. 10 provides a swap operation, as would be expected for an inverse Fredkin gate.

Where the system begins in the C state, the sweep of the first control parameter from C1 to C3 transitions the system into the R state. Referring to FIG. 3, the R state corresponds to the third excited state and the third contour 76. According, when the second classical control parameter is swept along the third contour 76 from A1 to A2, the R state is transformed into an A+R state. The sweep of the third classical control parameter from B1 to B3 transforms the A+R state into the B state. When the second classical control parameter is returned to A1 from A2, the B state is unaffected. Finally, since both the second qubit (A) and the first qubit (C) are tuned far from the resonator, sweeping the third classical control parameter from B3 back to B1 transfers a qubit from the third qubit (B) to the resonator, transitioning the system from the B state back into the R state. Returning the first classical control parameter to C1 from C3 transfers the photon from the resonator to the first qubit, returning the system in the C state.

Similarly, if the system begins in the ABC state, the sweep of the first classical control parameter from C1 to C3 places the system in the ABR state. With the second and third classical control parameters at A1 and B1, the state ABR is the eighth excited state of the system. The eighth excited state comprises linear combinations of the ABR, A2R, B2R, and 3R states, and is separated from the other excited states by a large gap, representing an avoided crossing. As a result, when the second and third control parameters are swept adiabatically, the system remains in the eighth excited state, however, the specific basis states will change. The sweep of the second control parameter from A1 to A2 transforms the ABR state into an ABR−B2R state. The sweep of the third classical control parameter from B1 to B3 transforms the ABR−B2R state into an A2R−3R state. The return of the second control parameter from A2 to A1 transforms the A2R−3R state into the A2R state, and the return of the third classical control parameter returns the system to the ABR state. Returning the first classical control parameter from C3 to C1 returns the system to the ABC state, again leaving the state of the system unchanged.

Figure 13:
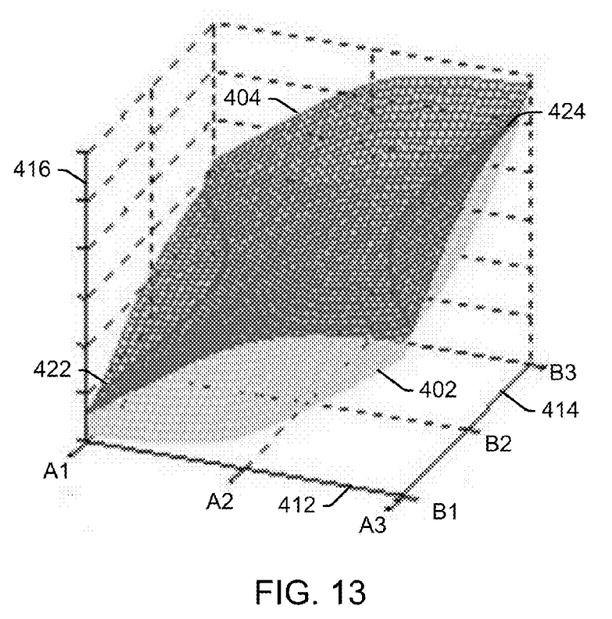
FIG. 13 illustrates an energy diagram of each of a first contour representing the fifth excited state of the qubit-resonator-qubit system and a second contour representing the sixth excited state of the qubit-resonator-qubit system.

With the system at point A1, B1 the states AR and BR are some combination of the fifth and sixth excited states of the system. FIG. 13 illustrates an energy diagram 400 of each of a first contour 402 representing the fifth excited state of the qubit-resonator-qubit system and a second contour 404 representing the sixth excited state of the qubit-resonator-qubit system as functions of the first classical control parameter, represented on a first axis 412 and the second classical control parameter, represented on a second axis 414, with a third axis 416 representing energy. It will be appreciated that the energy diagram of FIG. 13 assumes the second qubit and the third qubit are coupled to the resonator with unequal coupling strengths, as this has a significant effect on the behavior of the fifth and sixth energy states. Regions of degeneracy between the fifth excited state and the sixth excited are indicated in the diagram as solid lines 422 and 424.

The sweep of the third classical control parameter, as explained previously, transitions the AC state to the AR state and the BC state to the BR state. The effects of the additional operations the Fredkin gate algorithm on the AR and BR states can be explained with reference to FIG. 13. The sweep of the first classical control parameter from A1 to A2 transforms the AR state into an AR−2R state and the BR state into an AB+BR state. The sweep of the second classical control parameter from B1 to B3 transforms the AR−2R state into an AB−BR state and the AB+BR state into an AR+2R state. Returning the first control parameter to A1 transforms the AB−BR state into the AB state and the AR+2R state into a 2R state. Returning the second control parameter to B1 transforms the AB state into the AR state and the 2R state into the BR state. The net effect is to leave both the AR and BR states undisturbed.

Figure 14:
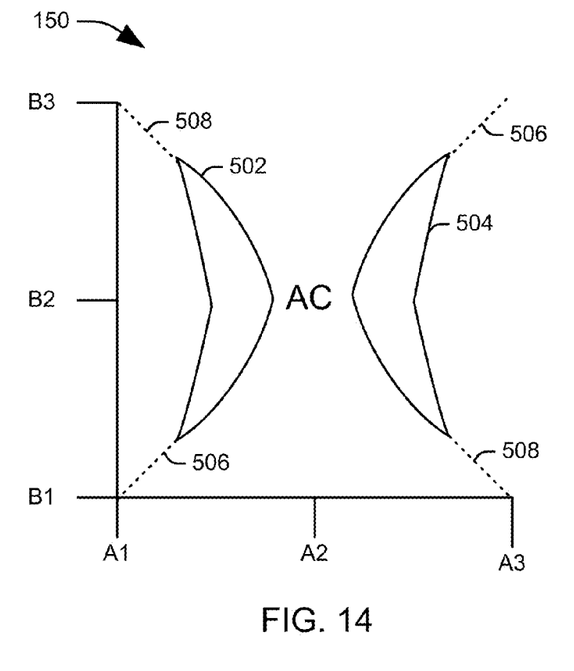
FIG. 14 illustrates a graphical depiction of the behavior of the system when the method of FIG. 10 begins in the AC or BC state.

It will be appreciated that the implementation presented in FIG. 12 is merely exemplary, and that a method in accordance with the present invention can be performed in any of a number of ways. For example, FIG. 14 illustrates a graphical depiction 500 of the behavior of the system when the method of FIG. 10 begins in the AC or BC state. High fidelity gates can be performed by first choosing a sweep rate that will perform an adiabatic sweep through the avoided crossing (AC) at point A2, B2. Having chosen that rate, the irregularly shaped regions 502 and 504 in FIG. 14 are regions where no high fidelity gate can be performed. The dashed lines 506 and 508 represent locations where the fifth and sixth excited states intersect or nearly intersect. As the control parameters are swept across these lines, a jump operation occurs. Away from these lines and the low fidelity regions, the energy levels are spaced far apart and a sweep through these regions will produce a high fidelity adiabatic sweep.

Accordingly, it will be appreciated that a high fidelity inverse Fredkin operation can be performed by sweeping the first classical control parameter to transfer the quantum state of qubit C into the resonator, and transitioning each of the second classical control parameter and the third control parameter to trace a closed loop around one of the low fidelity regions 502 and 504 in FIG. 14. Since the closed loop will cross two of the dashed lines, two jump operations will occur and the AR and BR states will be returned to their initial state in accordance with an inverse-Fredkin operation. The first classical control parameter can then be swept back to C1 to complete the inverse-Fredkin operation. Other possible variations can include sweeping the second and third classical control parameters part of the way through the closed loop, (e.g., to a point near A2, B3), prior to sweeping the first control parameter or sweeping all three classical control parameters simultaneously. It is important, however, that the quantum state of qubit C be transferred into the resonator prior to performing the jump operations that cause the AR and BR states to be distinguished from the A and B states.

Figure 15:
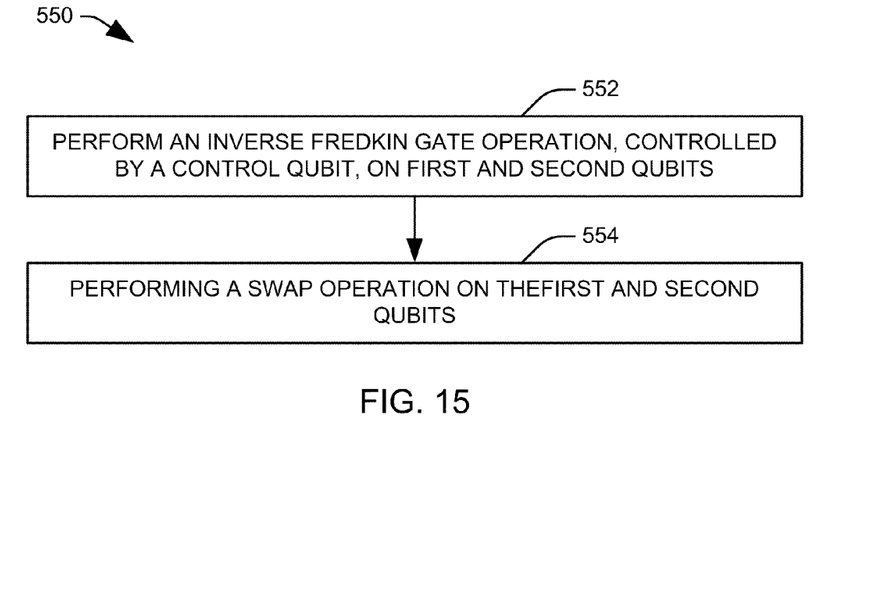
FIG. 15 illustrates a method for performing a Fredkin gate operation in accordance with an aspect of the present invention.
Figure 16:
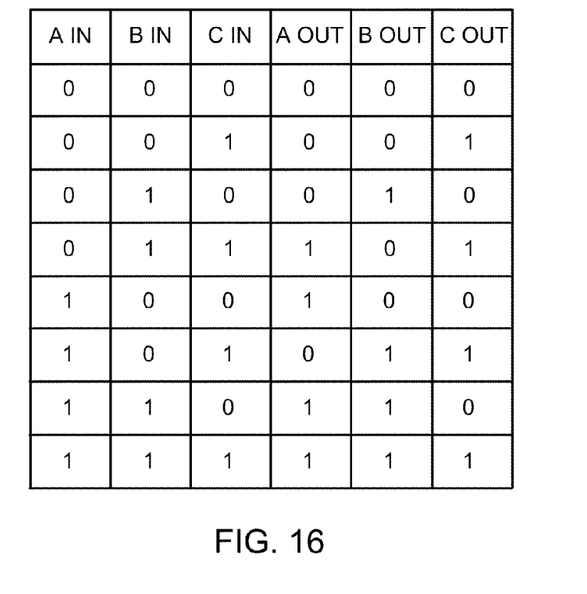
FIG. 16 illustrates a truth table describing the Fredkin gate operation.

FIG. 15 illustrates a method 550 for performing a Fredkin gate operation in accordance with an aspect of the present invention. A truth table for the Fredkin gate is provided as FIG. 16, with the qubit designed as C controlling the swap of the states of the qubits designed as A and B. At 552, an inverse Fredkin gate operation is performed. For example, the inverse Fredkin gate operation can be performed as set forth previously in FIG. 10. At 554, a swap operation is performed. For example, the swap operation can be performed as set out in FIG. 4 previously. It will be appreciated that a quantum circuit utilized to perform the inverse-Fredkin gate operation, for example, as shown in FIG. 9, can be used to perform the swap operation as well. Accordingly, the systems and method taught herein can be utilized to perform a quantum Fredkin gate operation with high fidelity and a significant tolerance for error.

The invention has been disclosed illustratively. Accordingly, the terminology employed throughout the disclosure should be read in an exemplary rather than a limiting manner. Although minor modifications of the invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

Having described the invention, we claim:

1. A method for performing a quantum gate operation, comprising:
adjusting a first classical control parameter, configured to tune an associated frequency of a first qubit, from a first value to a second value, the first value being selected such that the first qubit is tuned to a first frequency far from a characteristic frequency of an associated resonator and the second value being selected such that the first qubit is tuned to a second frequency near to the characteristic frequency of the resonator;
adjusting a second classical control parameter, configured to tune an associated frequency of a second qubit, from a third value to a fourth value, the third value being selected such that the second qubit is tuned to a third frequency far from the characteristic frequency of the resonator;
returning the first classical control parameter to the first value; and
returning the second classical control parameter to the third value.

2. The method of claim 1, wherein adjusting the second classical control parameter from the third value to the fourth value comprises adjusting the second classical control parameter such that an energy of a system formed by the first qubit, the second qubit, and the resonator is transitioned through an avoiding crossing of first and second excited energy states of the system.

3. The method of claim 2, wherein the avoiding crossing of the first and second excited energy states is a product of a coupling of the first qubit with the second qubit through the resonator.

4. The method of claim 1, wherein adjusting the second classical control parameter from the third value to the fourth value comprises adjusting the second classical control parameter such that an energy of a system formed by the first qubit, the second qubit, and the resonator is transitioned through an avoiding crossing of second and third excited energy states of the system.

5. The method of claim 4, wherein the avoiding crossing of the second and third excited energy states is a product of a coupling of the first qubit with the second qubit through the resonator.

6. The method of claim 1, wherein each of the first value, the second value, the third value, and the fourth value are selected such that the method provides a swap operation between the first qubit and the second qubit.

7. The method of claim 1, wherein adjusting the first classical control parameter and adjusting the second classical control parameter occurs substantially simultaneously.

8. The method of claim 1, wherein returning the first classical control parameter to the first value and returning the second classical control parameter to the third value occurs substantially simultaneously.

9. The method of claim 1, further comprising coupling the first qubit to the resonator with a first coupling strength and coupling the second qubit to the resonator with a second coupling strength, the second coupling strength being greater than the first coupling strength.

10. The method of claim 1, further comprising adjusting a third classical control parameter, configured to tune an associated frequency of a third qubit from a fifth value to a sixth value prior to each of adjusting the first classical control parameter and adjusting the second classical control parameter.

11. The method of claim 10, each of the fifth and sixth values being selected such that the third qubit is tuned to a frequency far from the characteristic frequency of the resonator.

12. The method of claim 10, each of the fifth and sixth values being selected such that if the third qubit is in an excited state, adjusting the third classical control parameter from the fifth value to the sixth value transitions the third qubit to a ground state and transitions the resonator into an excited state.

13. The method of claim 10, further comprising returning the third classical control parameter to the fifth value after each of returning the first classical control parameter to the first value and returning the second classical control parameter to the third value.

14. The method of claim 10, wherein each of the first value, the second value, the third value, the fourth value, the fifth value, and the sixth value are selected such that the method provides an inverse Fredkin gate operation between the first qubit and the second qubit, using the third qubit as a control.

15. A method for performing an inverse Fredkin gate operation utilizing resonator mediated coupling, comprising:
adjusting a first classical control parameter, configured to tune an associated frequency of a first qubit, from a first value to a second value, the first value being selected such that the first qubit is tuned to a first frequency far from a characteristic frequency of an associated resonator and the second value being selected such that the first qubit is tuned to a second frequency far from the characteristic frequency of the resonator;
adjusting a second classical control parameter, configured to tune an associated frequency of a second qubit, from a third value to a fourth value, the third value being selected such that the second qubit is tuned to a third frequency far from the characteristic frequency of the resonator and the fourth value being selected such that the second qubit is tuned to a fourth frequency near to the characteristic frequency of the resonator;
adjusting a third classical control parameter, configured to tune an associated frequency of a third qubit, from a fifth value to a sixth value, the fifth value being selected such that the third qubit is tuned to a fifth frequency far from the characteristic frequency of the resonator;
returning the second classical control parameter to the third value;
returning the third classical control parameter to the fifth value; and
returning the first classical control parameter to the first value.

16. The method of claim 15, wherein the first classical control value is returned to the first value after each of returning the second classical control parameter to the third value and returning the third classical control parameter to the fifth value.

17. The method of claim 15, further comprising performing a swap operation after the first classical control value is returned to the first value, the swap operation comprising:
adjusting the second classical control parameter from the third value to the fourth value;
adjusting the third classical control parameter from the fifth value to the sixth value;
returning the second classical control parameter to the third value; and
returning the third classical control parameter to the fifth value.

18. The method of claim 15, further comprising coupling the second qubit to the resonator with a first coupling strength and coupling the third qubit to the resonator with a second coupling strength, the second coupling strength being greater than the first coupling strength.

19. A quantum logic gate comprising:
a resonator;
a first qubit coupled to the resonator with a first coupling element, the first qubit and the first coupling element being configured to have a first coupling strength;
a second qubit coupled to the resonator with a second coupling element, the second qubit and the second coupling element being configured to have a second coupling strength, the second coupling strength being greater than the first coupling strength;
a first classical control mechanism coupled to the first qubit and configured to tune an associated frequency of the first qubit; and
a second classical control mechanism coupled to the second qubit and configured to tune an associated frequency of the second qubit.

20. The quantum logic gate of claim 19, further comprising a third qubit coupled to the resonator and a third classical control mechanism coupled to the third qubit to tune an associated frequency of the third qubit.

21. The quantum logic gate of claim 19, an associated frequency of the resonator being in the range of four to twenty gigahertz, the first classical control mechanism being configured to tune the first qubit in a frequency band around the frequency of the resonator, the frequency band having a width less than one gigahertz.

22. The quantum logic gate of claim 19, the second coupling strength being approximately fifty percent greater than the first coupling strength.

* * * * *